(12) United States Patent
Chen et al.

(10) Patent No.: US 11,102,909 B2
(45) Date of Patent: Aug. 24, 2021

(54) FRONT PANEL AIR DUCT

(71) Applicant: QUANTA COMPUTER INC., Taoyuan (TW)

(72) Inventors: Chao-Jung Chen, Taoyuan (TW); Yu-Nien Huang, Taoyuan (TW); Herman Tan, Taoyuan (TW); Yung-Hsiang Lu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 58 days.

(21) Appl. No.: 15/939,690

(22) Filed: Mar. 29, 2018

(65) Prior Publication Data

US 2019/0223317 A1 Jul. 18, 2019

Related U.S. Application Data

(60) Provisional application No. 62/616,641, filed on Jan. 12, 2018.

(51) Int. Cl.
| | |
|---|---|
| *H05K 5/00* | (2006.01) |
| *H05K 7/20* | (2006.01) |
| *H05F 1/00* | (2006.01) |

(52) U.S. Cl.
CPC ........... *H05K 7/20009* (2013.01); *H05F 1/00* (2013.01); *H05K 7/20145* (2013.01); *H05K 7/20709* (2013.01)

(58) Field of Classification Search
CPC ... H05K 7/20009; H05K 7/20709; H05F 1/00
USPC ....................................................... 454/184
See application file for complete search history.

(56) References Cited

U.S. PATENT DOCUMENTS

| | | | |
|---|---|---|---|
| 3,359,883 A * | 12/1967 | Murphy | ................. F24F 13/06 454/306 |
| 6,364,009 B1 * | 4/2002 | MacManus | ........... H01L 23/367 165/185 |
| 6,552,898 B1 | 4/2003 | Noble | |
| 7,697,285 B2 | 4/2010 | Donowho et al. | |
| 7,817,430 B2 * | 10/2010 | Sherrod | ............ H05K 7/20736 211/41.17 |
| 9,622,387 B1 | 4/2017 | Czamara | |
| 2005/0276017 A1 | 12/2005 | Aziz et al. | |

(Continued)

FOREIGN PATENT DOCUMENTS

| | | |
|---|---|---|
| JP | 2004235258 A | 8/2004 |
| JP | 3128289 U | 1/2007 |

(Continued)

OTHER PUBLICATIONS

Extended European Search Report for EP Application No. 18215642.2, dated May 24, 2019.

(Continued)

*Primary Examiner* — Helena Kosanovic
(74) *Attorney, Agent, or Firm* — Nixon Peabody LLP

(57) ABSTRACT

An air duct that can be attached to existing grille of an electronic device to improve airflow and reduce overall system impedance/pressure drop without increasing the power to an air mover. The air duct has a wall configuration to smooth-out airflow while simultaneously delivering more airflow to selected portions of the interior of an electronic device, such as a server.

17 Claims, 2 Drawing Sheets

(56) References Cited

U.S. PATENT DOCUMENTS

2008/0285232 A1\* 11/2008 Claassen ............ H05K 7/20736
                                                          361/694
2013/0141863 A1    6/2013 Ross et al.

FOREIGN PATENT DOCUMENTS

JP      2014158051 A    8/2014
TW       201037259 A   10/2010

OTHER PUBLICATIONS

TW Office Action for Application No. 107127679, dated Feb. 25, 2019, w/ First Office Action Summary.
TW Search Report for Application No. 107127679, dated Feb. 25, 2019, w/ First Office Action.
JP Office Action for Application No. 2018-247062, dated Jan. 7, 2020, w/ First Office Action Summary.

\* cited by examiner

FRONT PANEL AIR DUCT

CROSS-REFERENCE TO RELATED APPLICATIONS

This application is a U.S. Non-Provisional patent application which claims domestic benefit under 35 U.S.C. § 119 of U.S. Provisional patent application Ser. No. 62/616,641, filed Jan. 12, 2018, the entire disclosure of which is herein incorporated by reference in its entirety.

TECHNICAL FIELD

The present disclosure provides air ducts for the purpose of guiding air flow introduction to servers or other electronic equipment, but without the need for increasing impedance of the air flow, or increase in power necessary to cool the server or electronic equipment.

BACKGROUND

Conventional systems for cooling electronic equipment, such as servers, switches, and storage systems, have a flat front bezel (panel) with several grilles for air flow as shown in FIG. 1 (Prior Art). With a flat front bezel, the restricted entry of air as its passes through the front panel is like a sudden contraction flow, which can cause pressure drop due to minor loss. This effect will result in either a lower flow of incoming (cooling) airflow into the system, or the requirement for additional power for operating the air mover in the system.

In some fields of utilization, a heat generating component is populated immediately behind a specific part of the grille. Therefore, the grille requires a greater air flow rate to cool the heat generated by that component, in comparison to other parts of the electronic device which are blank (without any components or with no heat generating components). The traditional solution is to reduce the openings in the grille in front of the blank portions, with the intention of focusing more airflow through the grille immediately in front of the heat-generating component. However, this solution will cause higher system impedance which leads to additional air mover power consumption.

Adding an additional air duct to the front panel could help in assisting the focus of air delivery to a specified portion of the electronic component, or to a specific heat generating component within the electronic component. The profile of any such air duct should be designed such that the duct could smoothen the air inlet flow to reduce the pressure drop, and increase air flow rate of a specific grille with lower air mover power consumption.

SUMMARY

In order to overcome the problems associated with the prior art flat front panel and grille system, the present inventors have provided, in a first embodiment, an air duct having a curved surface, with the intention of not only smoothing out the airflow through the duct, but also to provide a guide for the airflow to a desired specific portion of the front panel.

According to another embodiment of the present disclosure, the air duct could be placed on a portion of the existing front panels of electronic equipment, so as to focus the air flow on a heat generating components within the electronic equipment and/or to prevent air flow to portions of the electronic equipment which are blank or devoid of heat generating components.

In a still further embodiment of the present disclosure, the air duct itself may be provided with additional opening within portions of the walls of the air duct, to admit additional air flow into the air duct to provide greater air cooling effect or increased airflow through the air duct.

This and other embodiments of the disclosure will be better understood when read in conjunction with the detailed description and the appended drawings.

DETAILED DESCRIPTION

Figure 1:
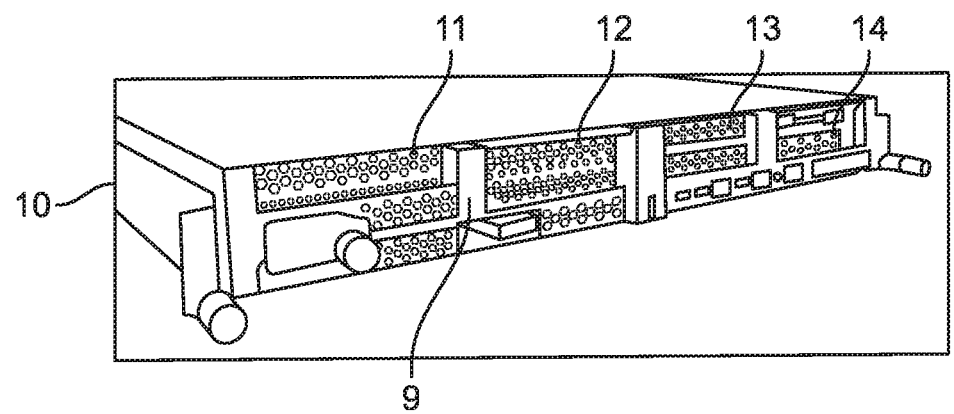
FIG. 1 (Prior Art) is a schematic representation of an existing front panel of an electronic component according to the prior art, having several grilles to permit air flow through the grilles.

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is illustration of the current state of the art of an electronic device 10 comprising a flat front bezel 9 having grilles 11, 12, 13, and 14 therein. The grilles permit cooling air flow to enter the electronic device 10 for purposes of cooling heat generating components (not shown) contained within electronic device 10. The electronic device 10 can be selected from a server, a switch, and other electronic devices. Arranged within electronic device 10 could be one or more heat generating components, such as a central processing unit ("CPU"), a graphics processing unit ("GPU"), and similar components. While the positioning, arrangement, or layout of these heat generating components is not part of this disclosure, the positioning of the air duct 20 (FIG. 2) assists in directing the air flow to cool these heat generating components, while avoiding air flow to sections of the electronic device 10 which are blank (or do not contain a heat generating component). In this manner, air duct 20 directs the air flow to the position in which it is needed within electronic device 10.

Figure 2:
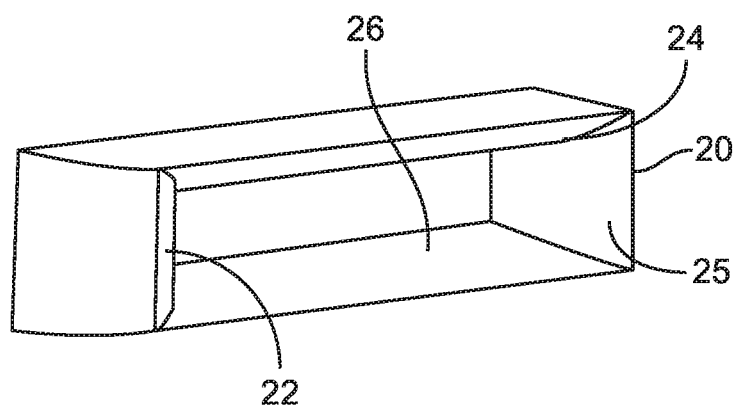
FIG. 2 is a schematic representation of an air duct according to one embodiment.

FIG. 2 illustrates air duct 20. Air duct 20 could be manufactured out of several suitable materials, including metal, plastics (polymers), composite materials and combinations thereof. Plastics and composites are preferred because they are lightweight and the polymers which form the plastics could contain fillers that make the air duct static free. Suitable fillers include carbon, graphite, metal flakes, or metal powders and other materials that will dissipate any electrical charges created by static electricity. Composites can include a polymer and some type of reinforcing material, such as filaments, natural, synthetic or glass fibers, batts, woven and non-woven fabrics, rovings, tapes, metal wires, screens, or reticulated forms of metal, metalized coatings and films, and other reinforcing components. At least one of the reinforcing materials can include a static electricity dissipating material, such as carbon, graphite, or metal fibers. Alternatively, a non-static dissipating material may be used, provided that it also comprising the fillers or other materials that will dissipate static electricity. An air duct without a static electricity dissipating material can also be used, but the attraction of dust or other air entrained particulates within the airflow may be attracted to the air duct. A separate air filtering device can then be used in combination with the air flow to filter out entrained particulate within the air flow. A metal framework or reinforcement covered in a polymer coating could also be used to form the air duct of the disclosure. The air duct can be provided with slightly curved interior walls 22, 24, 25, and 26, or other configurations to smooth the flow of air through the air duct 20.

Figure 3A:
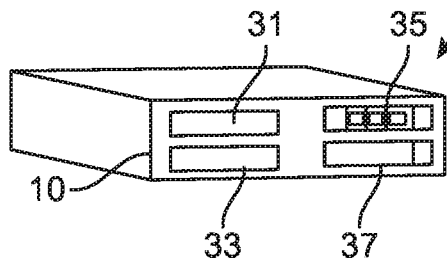
FIG. 3A is a simplified system for air modeling wherein a flat panel with grilles is illustrated.
Figure 3B:
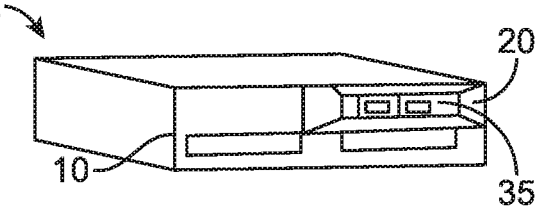
FIG. 3B is a simplified system for air modeling wherein a flat panel with grilles similar to FIG. 3A is illustrated, but including an air duct according to an embodiment of the disclosure.

FIG. 3A is one form of simplified system 30 used for thermal modeling of air flow into electronic device 10. FIG. 3B is another form of simplified system 32 which includes air duct 20 on electronic device 10. As is apparent the available airflow will enter all parts of grilles 31, 33, 35 and 37 in FIG. 3A. In FIG. 3B air flow will be concentrated by air duct 20 into grille 35.

Figure 5A:
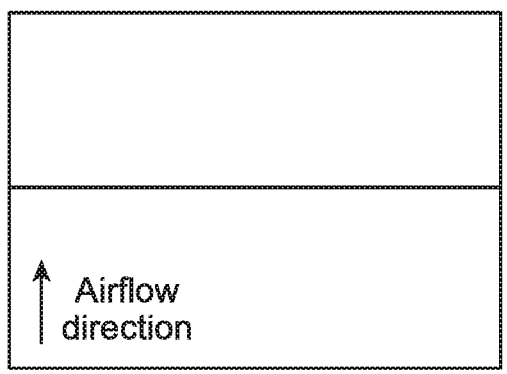
FIG. 5A is an airflow contour comparison without an air duct.
Figure 5B:
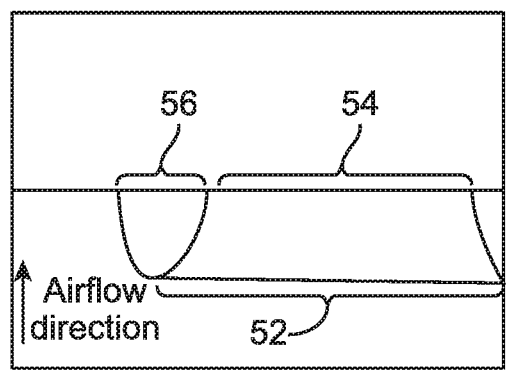
FIG. 5B is an airflow contour comparison with an air duct according to an embodiment of the disclosure.

As can be seen in FIG. 5A, the airflow through electronic device 10, without an air duct, is generally evenly distributed throughout interior of electronic device 10, even in areas or portions which are blank or devoid of any heat generating component, such as a CPU or GPU. On the other hand, FIG. 5B illustrates the concentration and direction of incoming air flow 52 into a concentrated air flow area 54. If a heat generating component (not shown) were positioned downstream of air flow 54, it would benefit from the concentrated air flow 54. Additionally, area 56 is essentially devoid of a cooling stream of air flow. A blank portion or a portion devoid of a heat generating component could therefore be arranged in this section of electronic device 10 and none of the available air flow would be wasted in cooling this portion of electronic device 10. It is also within the scope of this disclosure to position one or more of the air ducts 20 so as to increase the efficiency of cooling of existing electronic devices 10 having a prearranged arrangement of components therein. From the simulation result of FIG. 5B, as compared to FIG. 5A, airflow contour for the case with air duct is clearly much smoother than the result without an air duct. Measurements show about a 7.6% improvement in airflow rate through the portion of the electronic device with the air duct, while the overall system impedance/pressure drop is also improved by about 7.1%. These improvements are achieved without increasing the power to the air mover, resulting in unexpected improvement in cooling effect. One of ordinary skill in the art, to which this disclosure is directed, would be able to arrange one or more air ducts to increase the efficiency of cooling of components within electronic device 10, but without increasing the power input of any air mover used to create an airflow for electronic device 10.

Figure 4:
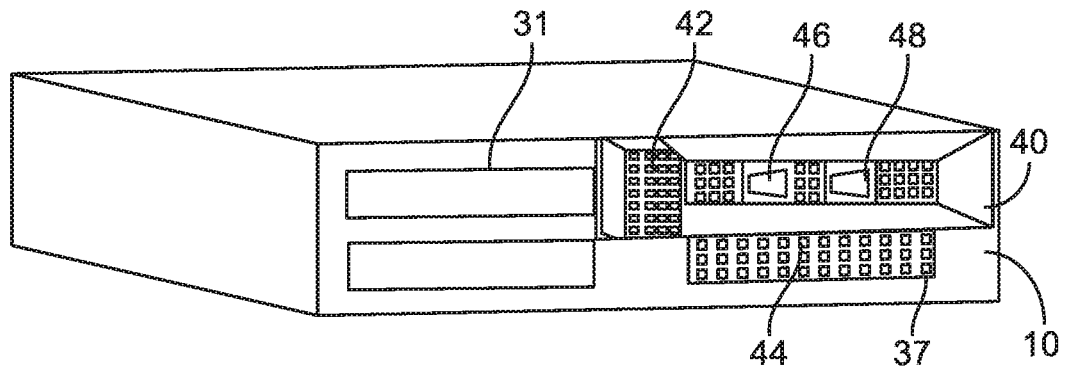
FIG. 4 is a schematic representation of another embodiment of an air duct in combination with flat panel with grilles is illustrated.

FIG. 4 is illustrative of another form of air duct 40 according to the present disclosure arranged on an electronic device 10. Air duct 40 has self-sustaining reticulated areas 42, 44 on the left side and bottom portions of duct 40, as illustrated in FIG. 4 respectively. The reticulated area 42 can be initially formed in air duct 40 upon formation of air duct 40, or may be post-formed therein by any suitable mechanical action, such as punching, drilling, broaching, and similar mechanical shaping methods. Similarly, the reticulated area 44 can be made in a manner similar to or different from the manner in which reticulated area 42 is made. For example, area 42 may be initially formed during formation of air duct 40 and reticulated area 44 may be post formed, or vice-versa. The self-sustaining reticulated areas 42 and 44 serve the same purpose by permitting additional air to enter the air duct 40, and then introducing that air into the interior of electronic device 10. This is especially useful where the interior of electronic device 10 is blank or devoid of heat generating components downstream of grille 31. The interior of electronic device 10 would thus not benefit from airflow through grille 31, but would benefit by additional air flow through self-sustaining reticulated portion 42 of air duct 40. The same would be true if the area behind grille 37 is blank or devoid of heat generating components, whereas additional air flow through reticulated area 44 would beneficially increase the air flow through air duct 40.

The foregoing description of different embodiments of air ducts can also be used in combination with internal baffling, or ducts within electronic device 10, to beneficially increase the air flow to certain interior portions of electronic device 10. For example, elements 46 and 48 can represent the input openings of internal ducts (not shown) within electronic device 10. By preferentially introducing the air flow into elements 46 and 48, the air flow to certain portions of the interior of electronic device 10 can be controlled.

The air duct of the embodiments may be attached to the flat bezel or electronic device 10 by any adhesive or mechanical fasteners, such as but not limited to, clips, screws, rivets, or other mechanical, or other chemical mechanisms. Examples of adhesive double-sided tape; pre-applied contact adhesive which is covered by a temporary, peelable, protective strip; fresh quick setting glue, etc. The mechanical fasteners, including screws, clips, or rivets can be formed of iron or its alloys; aluminum or its alloys; copper or its alloys, including brass; or polymeric materials such as nylon 6, nylon 66, fluorinated polymers, ceramics, and other materials used for fasteners. Other fasteners include hook and loop fasteners. The air duct itself may be integrally formed with one or more fastening devices, which may be the same or different from the group comprising hooks, clamps, pincers, grapnels, etc. The air duct may also be made to be slightly compressible, so as to be retained by the electronic device through a friction fit upon release of a compressive force on the air duct. Other manners of combining the air duct of the present disclosure with existing grilles on electronic devices, such as electronic device 10, will be apparent to those skilled in the art without the exercise of invention.

While we have illustrated the air duct as a quadrilateral-sided configuration with a central opening, it is to be understood that the air duct can have different shapes, including less or more than four sides, or no sides, such as elliptical, ovate, circular, or another curved shape, or an opening offset from a central position, without departing from the teachings of this disclosure.

It is to be expressly understood that the various embodiments described herein are exemplary only, and not limiting, as those skilled in the art to which this application is directed, will, upon reading this disclosure, envision other modifications and embodiments to implement the teaching of this disclosure without the exercise of invention.

We claim:

1. An air duct in combination with an electronic device, the air duct being attachable to an external portion of the electronic device;
   the electronic device comprising:
      a front panel;
      a first grille exposed from the front panel; and
      a second grille exposed from the front panel and positioned at a distance from the first grille, the distance defining a flat bezel of the front panel wherein the front panel includes a portion recessed from the flat bezel on which the first grille and the second grille are disposed; and
   the air duct comprising:
      a proximal portion attachable to the front panel of the electronic device, the proximal portion being positioned upstream of the first grille;
      a distal portion configured to receive a flow of air from outside the electronic device, a maximum width of the distal portion being greater than (i) a maximum width of the proximal portion and (ii) a maximum width of the first grille, such that the air duct is configured to increase the flow of air toward the first grille to a specific portion of an interior of the electronic device and away from the flat bezel, wherein an external width of the air duct decreases from the distal portion to the proximal portion; and
      a self-sustaining reticulated area comprising a plurality of holes on a side of the distal portion, the self-sustaining reticulated area being upstream of the flat bezel of the front panel.

2. The combination of the air duct and electronic device of claim 1,
   wherein the electronic device further comprises a heat generating component in the interior thereof, the heat generating component being positioned downstream of the first grille; and
   wherein the air duct is configured to increase the flow of air towards the heat generating component.

3. The combination of the air duct and electronic device of claim 1,
   wherein the second grille of the electronic device is blank in the interior thereof; and
   wherein the air duct is configured to decrease the flow of air towards the second grille.

4. The combination of the air duct and electronic device of claim 3, wherein the electronic device is devoid of a heat generating component downstream of the second grille.

5. The combination of the air duct and electronic device of claim 1, wherein an external outline of the air duct is quadrilateral.

6. The combination of the air duct and electronic device of claim 1, wherein the air duct is plastic, metal, composite, or any combination thereof.

7. The combination of the air duct and electronic device of claim 1, wherein the air duct is formed from a material so as to dissipate static electricity.

8. The combination of the air duct and electronic device of claim 1, wherein the air duct is attached to the electronic device through at least one of adhesive and mechanical fasteners.

9. An air duct in combination with an electronic device, the electronic device comprising a flat bezel separated by a first grille and a second grille, the first grille and the second grille positioned downstream of the flat bezel the air duct being attachable to the first grille, the air duct comprising:
   a proximal portion attachable to the first grille, the proximal portion being positioned upstream of the first grille;
   a distal portion configured to receive a flow of air from outside the electronic device, a maximum width of the distal portion being greater than (i) a maximum width of the proximal portion and (ii) a maximum width of the first grille, such that the air duct is configured to increase the flow of air to a specific portion of an interior of the electronic device, wherein an external width of the air duct decreases from the distal portion to the proximal portion; and
   a self-sustaining reticulated area comprising a plurality of holes on a side of the distal portion, the self-sustaining reticulated area being upstream of the flat bezel of the front panel.

10. The combination of the air duct and electronic device of claim 9, wherein the air duct is plastic, metal, composite, or any combination thereof.

11. The combination of the air duct and electronic device of claim 9, wherein the air duct is formed from a material so as to dissipate static electricity.

12. The combination of the air duct and electronic device of claim 9, wherein an external outline of the air duct is quadrilateral.

13. The combination of the air duct and electronic device of claim 9, wherein the electronic device is a server having at least one heat generating component positioned downstream of the first grille, and at least one blank space devoid of a heat generating component positioned downstream of the second grille.

14. The combination of the air duct and electronic device of claim 9, wherein the air duct further comprises at least one static electricity dissipating element.

15. The combination of the air duct and electronic device of claim 9, wherein the air duct is sized and shaped to achieve at least a 7% improvement in airflow rate, and an overall system impedance/pressure drop of at least 7% without increasing power to an air mover.

16. The combination of the air duct and electronic device of claim 1, wherein the air duct has more than one reticulated area.

17. The combination of the air duct and electronic device of claim 1, wherein the flat bezel of the front panel is devoid of the flow of air.

* * * * *